United States Patent [19]

Simon et al.

[11] 4,072,940
[45] Feb. 7, 1978

[54] DIGITAL TO ANALOG RESOLVER CONVERTER

[75] Inventors: David Julian Simon, Saddle Brook; Edward Charles Costello, Paterson, both of N.J.

[73] Assignee: The Singer Company, Little Falls, N.J.

[21] Appl. No.: 691,272

[22] Filed: June 1, 1976

[51] Int. Cl.² .............................................. H03K 13/02
[52] U.S. Cl. ......................... 340/347 SY; 340/347 M; 340/347 DA; 318/569; 318/661; 364/607
[58] Field of Search ................. 340/347 SY, 347 DA, 340/347 M; 235/186, 197, 150.53; 318/569, 661

[56] References Cited

U.S. PATENT DOCUMENTS

| 3,295,125 | 12/1966 | Idelsohn et al. | 340/347 SY |
| 3,335,417 | 8/1967 | Adler et al. | 340/347 SY |
| 3,662,379 | 5/1972 | Miller et al. | 340/347 DA |
| 3,668,693 | 6/1972 | Eaton et al. | 340/347 SY |
| 3,675,234 | 7/1972 | Metz | 340/347 SY X |
| 3,696,407 | 10/1972 | Egerton | 340/347 SY |
| 3,713,141 | 1/1973 | Higgins et al. | 340/347 SY |
| 3,974,498 | 8/1976 | Kmier | 340/347 SY X |
| 3,987,434 | 10/1976 | Endo et al. | 340/347 SY |

Primary Examiner—Thomas J. Sloyan
Attorney, Agent, or Firm—T. W. Kennedy

[57] ABSTRACT

A digital to analog resolver converter uses a digital to analog converter to convert a part of the digital input to a corresponding analog angle value. This analog angle value is applied to sine and cosine function generators which use the equations of chords to approximate the value of the sine and cosine functions in one octant. Bits of the digital input are used to select slope values from the chord equations for approximating the sine and cosine of the analog angle value. The digital to analog resolver converter uses the minimum number of precision resistors to generate the sine and cosine slope and intercept values for the equations of a given number of approximating chords.

10 Claims, 11 Drawing Figures

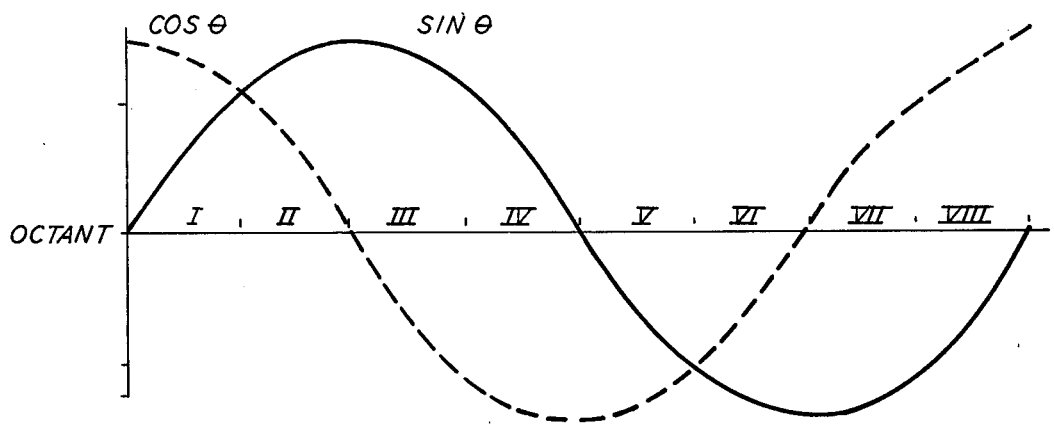
FIG. 1a
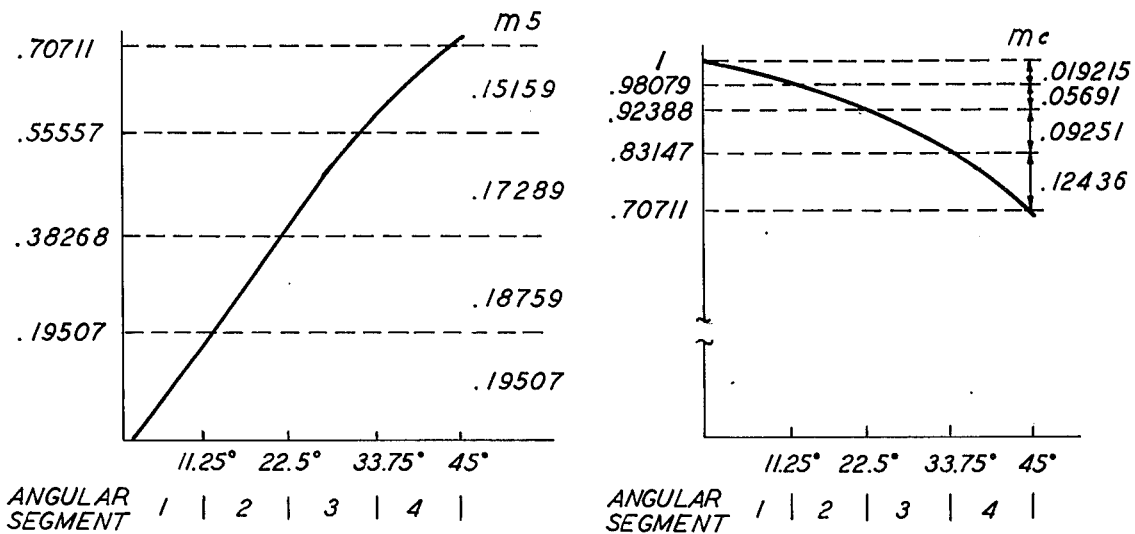
FIG. 1b
| ANGULAR SEGMENT | SINE | | COSINE | |
|---|---|---|---|---|
| | INTERCEPT | SLOPE | INTERCEPT | SLOPE |
| 1 | 0 | .19507 | +1 | .019215 |
| 2 | .19507 | .18759 | .98079 | .05691 |
| 3 | .38268 | .17289 | .92388 | .09241 |
| 4 | .5557 | .15159 | .83147 | .12435 |
FIG. 1c

| ANGULAR SEGMENT | SINE | | COSINE | |
|---|---|---|---|---|
| | INTERCEPT | SLOPE | INTERCEPT | SLOPE |
| 1 | .5557 | .15159 | −.83147 | .12435 |
| 2 | .38268 | .17289 | −.92388 | .09241 |
| 3 | .19507 | .18759 | −.98079 | .05691 |
| 4 | 0 | .19507 | −1 | .019215 |

| OCTANT | FUNCTION | FUNCTION GENERATOR OUTPUT USED TO APPROXIMATE SINE | FUNCTION GENERATOR OUTPUT USED TO APPROXIMATE COSINE | Sign of Sine | Sign of Cosine |
|---|---|---|---|---|---|
| I | NOT COMPLEMENTED | SINE FUNCTION GENERATOR | COSINE FUNCTION GENERATOR | POSITIVE | POSITIVE |
| II | COMPLEMENTED | COSINE FUNCTION GENERATOR | SINE FUNCTION GENERATOR | POSITIVE | POSITIVE |
| III | NOT COMPLEMENTED | COSINE FUNCTION GENERATOR | SINE FUNCTION GENERATOR | POSITIVE | NEGATIVE |
| IV | COMPLEMENTED | SINE FUNCTION GENERATOR | COSINE FUNCTION GENERATOR | POSITIVE | NEGATIVE |
| V | NOT COMPLEMENTED | SINE FUNCTION GENERATOR | COSINE FUNCTION GENERATOR | NEGATIVE | NEGATIVE |
| VI | COMPLEMENTED | COSINE FUNCTION GENERATOR | SINE FUNCTION GENERATOR | NEGATIVE | NEGATIVE |
| VII | NOT COMPLEMENTED | COSINE FUNCTION GENERATOR | SINE FUNCTION GENERATOR | NEGATIVE | POSITIVE |
| VIII | COMPLEMENTED | SINE FUNCTION GENERATOR | COSINE FUNCTION GENERATOR | NEGATIVE | POSITIVE |

FIG. 2

| A | B | OUTPUT |
|---|---|--------|
| 0 | 0 | INPUT "0" |
| 0 | 1 | INPUT "1" |
| 1 | 0 | INPUT "2" |
| 1 | 1 | INPUT "3" |

| BIT: | $2_1$ | $2_2$ | $2_3$ | $2_4$ | $2_5$ | $2_6$ | $2_7$ | ... | $2_{14}$ |
|---|---|---|---|---|---|---|---|---|---|
| BIT REPRESENTS: | 180° | 90° | 45° | 22.5° | 11.25° | 5.625° | 2.8125° | ... | 360° |
| SAMPLE INPUT | 0 | 0 | 0 | 0 | 1 | 1 | 0 | ... | 0 |

DIGITAL TO ANALOG RESOLVER CONVERTER

BACKGROUND OF THE INVENTION

Description of the Prior Art

This invention relates to digital to analog converters in general and more particularly to an improved digital to analog resolver converter.

A digital signal consisting of n bits can be used to represent the magnitude of an angle in radians or degrees, with the least significant bit representing $360/2^n$° or $2\pi/2^n$ radians. To simplify the discussion of the invention, all values will be stated in degrees, since radians can easily be substituted for degrees.

The n-bit digital signal representing the magnitude of an angle can be described by the notation $2_1 2_2 \ldots 2_n$. Throughout this disclosure, the most significant bit ($2_1$) will be referred to as the first bit, the second most significant bit ($2_2$) as the second bit, and so forth, down to the least significant ($2_n$) or nth bit.

It is evident that the less significant bits of the digital input signal only represent the magnitude of the angle over a given range of angular values. For example, the sixth through nth bits represent a range of angular values from 0° up to 11.25°.

The prior art includes devices capable of converting a digital signal representing the magnitude of an angle to an analog signal representing the magnitude of the angle. These devices use switching networks to control the output of R-2R resistance ladders and generate an analog signal proportional to the digital input signal.

Prior art devices also exist which generate analog resolver functions corresponding to digital inputs. One type of device utilizes a digital sensor and digital to analog converter to provide proportional error signal to a servo-mechanism control shaft which positions an electromechanical resolver device to generate an output. Resolver functions can also be generated by two ladder networks or a multiplexed single ladder. Some solid state devices use programmed memory devices ("look up tables") to convert a digital angle signal to digital sine and cosine signals to generate a resolver function. Other solid state devices convert digital angle values to analog tangent angle values utilizing non-linear resistance networks. The tangent angle values are related to the reference voltage in a manner similar to a resolver function output.

All of these devices have serious disadvantages. The use of servo-mechanisms for digital to resolver conversions entails substantial cost, size, weight, accuracy and life disadvantages. The two ladder method involves use of an additional ladder and creates problems in tracking accuracy of the two ladders when the temperature changes. The open multiplexed single ladder needs additional circuitry for the multiplex function, involves additional phase lag errors proportional to the ratio of the multiplex frequency to the carrier frequency, and creates variations in scale factor as a function of angle. Solid state digital angle to resolver converters with "look-up tables" use too many discrete parts to achieve acceptable accuracy. Digital angle to tangent angle conversion devices have difficulty in accurately approximating the tangent function with non-linear analog means.

Copending U.S. patent application Ser. No. 624,740 discloses a solid state digital angle converter utilizing a single ladder network. This resolver is similar to the instant invention in using the concept of dividing the sine and cosine functions into segments and making linear approximations to these segments. However, this resolver uses two precision resistors to simulate many of the segments while the instant invention uses only one precision resistor to simulate most of the segments. The use of the minimum number of precision resistors reduces cost, lessens the likelihood of error in approximating the sine and cosine function, and allows monotonicity between the approximating chord segments.

SUMMARY OF THE INVENTION

The present invention generates analog sine and cosine values corresponding to a digital signal representing the magnitude of an angle by using chords to approximate the value of these trigonometric functions over a range of at least 45° (an octant) and then uses switching networks to generate the value of the sine and cosine functions over the entire 360° range.

It should be noted that the sine and cosine functions are the only trigonometric functions which are continuous over an entire 360° range of angular values. Thus, in this disclosure the term "continuous periodic trigonometric functions" will be used to refer to either the sine or cosine function.

By using more chords the accuracy of the approximation over a given range of angular values can be increased as desired. The error in the computation is approximately equal to $0.016L^3$, where L is the length of the chord in radians. For example, if 11.25° chord lengths are used to approximate the sine and cosine functions, the tangent function, which measures resolver performance, can be generated to within 0.41 minutes of arc.

This invention has many advantages over the prior art devices. It uses a single set of electronic switches to control a common ladder network to generate the sine and cosine functions, thereby reducing complexity and cost of the converter, improving reliability, and reducing maintenance.

The invention synthesizes the sine and cosine functions accurately as a ratio (the tangent function) with limiting factors established on the basis of chord length. This allows desired accuracy to be obtained with a minimum of complexity of components and minimum costs and permits a more efficient interface with electromechanical devices. Furthermore, the invention uses the minimum number of precision resistors necessary to accomplish the approximation for each chord length. Each chord n can be approximated by the equation: $Y = m_n x + b_n$, wherein $m_n$ is the slope of the chord and $b_n$ is its intercept. The end point of each approximating line segment is the start of the next segment. Thus:

$$b_n = \Sigma m_{(n-1)} + b_1$$

Since each slope and intercept value is computed through the use of a precision gain resistor, the equation indicates that only one resistor need be added for each chord, thus minimizing the number of precision gain resistors needed.

Briefly, the invention involves the conversion of an n-bit signal representing the magnitude of an angle ($\theta$) into corresponding analog sine and cosine signals. Bits representing a range of angular value between two limits are converted by a conventional device into a corresponding analog angle value. The range of angular values is subdivided into "angular segments" each covering an equal number of degrees within the angular range. The equation of a chord approximates the value of a continuous periodic trigonometric function for each angular segment. A slope and intercept selection circuit uses the value of higher order bits to select the appropriate chord equation to generate the sine or cosine value corresponding to the analog angle value. Since and cosine function generators compute the sine and cosine values. The sine and cosine values are then applied to a circuit which selects the appropriate sine and cosine values for use as the value of sine $\theta$ and cosine $\theta$ for a given $\theta$ and generates the correct sign for sine $\theta$ and cosine $\theta$.

In a preferred embodiment of the invention each 45° octant is divided into four 11.25° angular segments. The sixth through nth bits of the digital input signal, representing an angular magnitude (B) between 0° and 11.25°, are applied to a conventional digital to analog converter consisting, for example, of electronic switches controlling an R-2R ladder. In odd numbered octants, a voltage equal to VREF×B/11.25° is generated, where VREF is a reference voltage. This voltage is applied to sine and cosine function generators. Each function generator uses the equations of four chords to approximate a trigonometric function over a 45° range. For the sine function generator, the equation for the first chord (0° to 11.25°) is $Y_{s1} = $ VREFX $((B/11.25°)$ $m_{s1} + b_{s1})$, where $m_{s1} = 0.19509$ and $b_{s1} = 0$. For the second angular segment (11.25° to 22.5°), the equation is $Y_{s2} = $ VREF$((B/11.25°)$ $m_{s2} + b_{s2})$, where $m_{s2} = 0.18759$ and $b_{s2} = b_{s1} = 0.19509$. Thus the intercept value of each equation is the sum of the slope values of previous equations. The equation for the cosine in the first angular segment is $Y_{c1} = $ VREF $(m_{c1}(B/11.25°) + b_{c1})$; where $b_{c1} = -1$ and $m_1 = 0.019215$. In the second angular segment, the equation is $Y_{c2} = $ VREF $(m_{c2}(B/11.25°) + b_{c2})$, where $m_{c2} = 0.05691$, and $b_{c2} = b_{c1} + m_{c2} = -.98079$. Again, the intercept is computed using the slopes of previous equations. Since each slope value is represented by a precision gain resistor, the same resistors used to generate slope values can be used to generate intercept values in other equations.

In even numbered octants, (e.g., 45° to 90°), the third bit is used as a complement command to generate the voltage VREF $(1-B/11.25°)$. The sine function is approximated in the first angular segment by the equation $Y_{s1} = $ VREF $(m_{s4}(1-B/11.25°) + b_{s4})$, where $m_{s4} = 0.15154$ and $b_{s4} = m_{s3} = m_{s2} + m_{s1} + b_{s1} = 0.55557$. The equation for the cosine function in the first angular segment is $Y_{c1} = $ VREF $(m_{c4}(1-B/11.25°) + b_{c4})$, where $m_{c4} = 0.12436$ and $b_{c4} = m_{c3} + m_{c2} + m_{s1} + b_{c1} = -0.83147$. As in the odd numbered octants, the intercept in each equation can be computed as the sum of the intercept of the first equation and the slopes of other equations.

The outputs of the sine and cosine function generators are fed into an octant and sign select circuit which uses the first, second and third bits to select the appropriate function generator output to use as sine $\theta$ and cosine $\theta$ in a particular octant, and assign its correct sign to sine $\theta$ and cosine $\theta$.

BRIEF DESCRIPTION OF THE DRAWINGS

FIGS. 1a – 1d illustrate the use of four according to this invention in order to approximate the sine and cosine functions in both even numbered and odd numbered octants.

FIG. 2 is a table showing the choice of functions generator outputs and signs to generate the sine and cosine functions over a 360° range.

DETAILED DESCRIPTION OF THE INVENTION

FIG. 1(a) shows the values of the sine and cosine function over a 360° range, with each function divided into numbered octants.

FIG. 1(b) shows the use of four chords to approximate the sine and cosine functions is an odd numbered octant (I). The octant is divided into four equal numbered angular segments. The value of the variable B varies from 0° to 11.25° along each angular segment. The equation for the chord approximating the nth angular segment of the sine function is $Y_{sn} = m_{sn}(B/11.25°) = b_{sn}$. The equation for the chord approximating the nth angular segment of the cosine function is $Y_{cn} = m_{cn}(B/11.25°) + b_{cn}$. FIG. 1(c) shows the values for the slope and intercept coefficients of the approximating chords in an odd numbered octant. For the sine function, the intercept coefficient of the chord approximating the nth angular segment is the sum of the first through (n−1)th slope coefficients. Similarly, for the cosine function, the intercept coefficient for the chord approximating the nth angular segment is the sum of the first intercept coefficient and the first through (n−1)th slope coefficients.

Figures 1D, 1E:
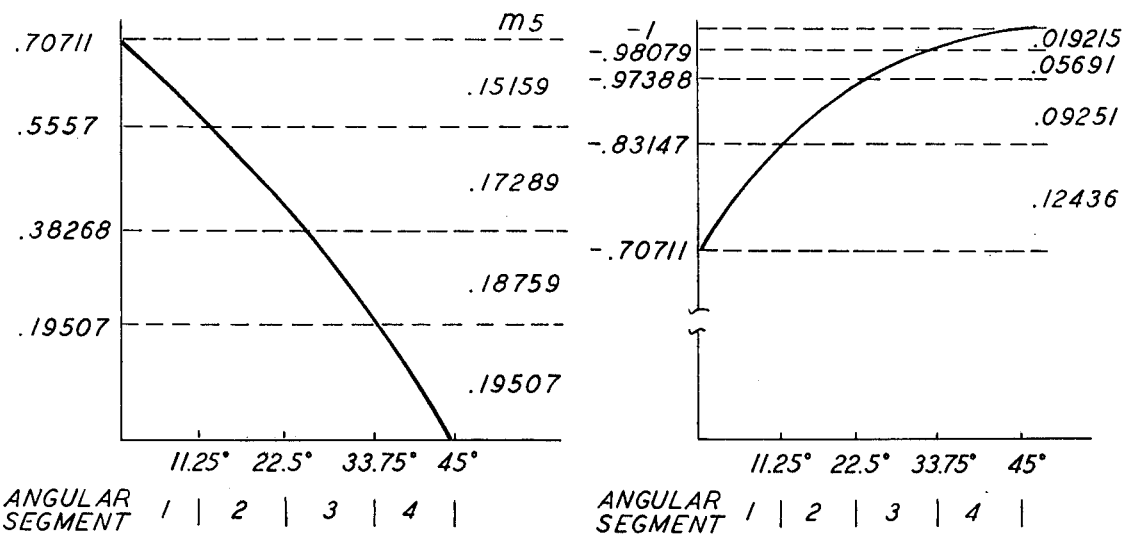

FIG. 1(d) shows the use of four chords to approximate the value of the sine and cosine functions in an even numbered octant. Again, the octant is divided into four numbered equal angular segments. The equation for the chord approximating the nth angular segment of the sine function is $Y_{sn} = m_{s(5-n)}(1-B/11.25°) + b_{s(5-n)}$. The equation for the chord approximating the nth angular segment of the cosine function is $Y_{cn} = m_{c(5-n)}(1-B/11.25°) + b_{c(5-n)}$.

FIG. 1(e) shows the values of the slope and intercept coefficients of the approximating chords in an even numbered octant. For the sine function, the intercept coefficient of of nth angular segment is the sum of the first up to (but not including) the (5−n)th intercept coefficient. For the cosine function the intercept coefficient of the nth angular segment is the sum of the first intercept coefficient and the first up to (but not including) the (5−n)th slope coefficient.

FIG. 2 shows how the output of the sine and cosine computation circuits can be used to generate an approximation of a continuous periodic trigonometric function over a 360° range of values. The 360° range of angular values is divided in four "even numbered octants" (II, IV, VI and VIII) and four "odd numbered octants" (I, III, V, and VII). for a given octant, FIG. 2 shows whether or not the intercept and slope selection circuit input is complemented, which output is used to approximate the sine and cosine functions, and the sign of the sine and cosine outputs.

Figure 3:
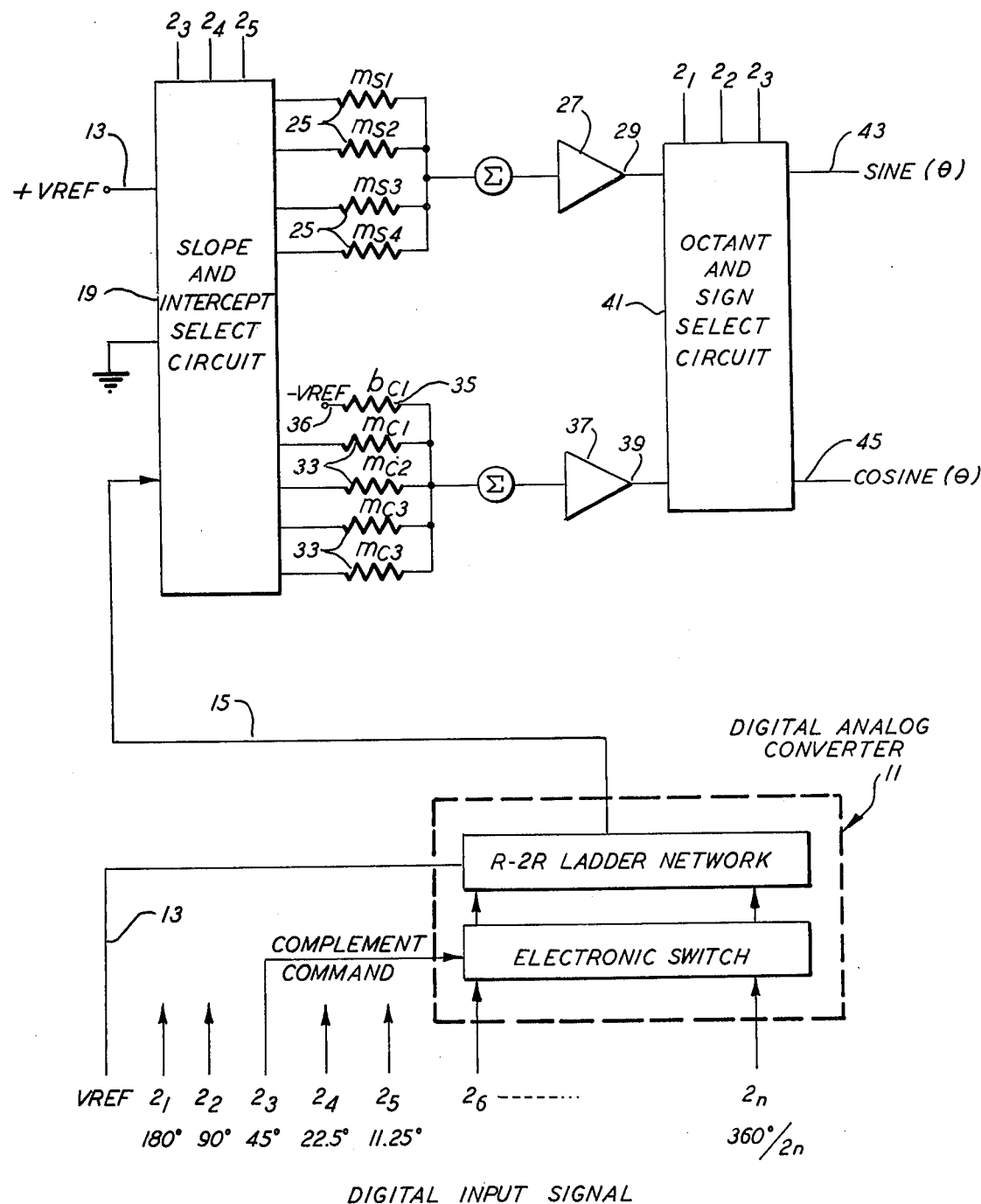
FIG. 3 is a block-circuit diagram of the preferred embodiment of the invention.

FIG. 3 shows a preferred embodiment of the invention. The digital input signal represents the magnitude of the angle θ. The sixth through nth bits, representing the magnitude of the angle B, are fed into a conventional digital to analog converter 11. A reference voltage VREF 13 at 400hz is also fed into the converter 11. The output on line 15 of the converter 11, which represents either VREF (B/11.25°) or VREF (1−B/11.25°), depending on the value of the complement command 17, is fed into the slope and intercept selection circuit 19.

The slope and intercept selection circuit 19 uses the third, fourth and fifth bits of the digital input signal to connect precision resistors 25 representing the sine slope values to either VREF terminal 13, the converter output on line 15 or ground. Summing amplifier 27 adds the voltages representing the sine slope and intercept values to produce a sine function output on line 29. The slope and intercept selection circuit 19 also connects precision resistors 33 representing the cosine slope values to VREF terminal 13, the converter output on line 15 or ground. The precision resistor 35 representing the first cosine intercept is connected to VREF terminal 36. Summing amplifier 37 adds the voltages representing the cosine slope and intercept values produce a cosine function output on line 39. Octant and sign select circuit 41 uses the first, second and third bits of the digital input signal to decide which of the sine function output on line 29 and cosine function output on line 39 is designated as the sine output on line 43 and cosine output on line 45, and to assign its correct sign to the sine output on line 43 and the cosine output on line 45 in accordance with FIG. 2.

Figures 4A, 4B:
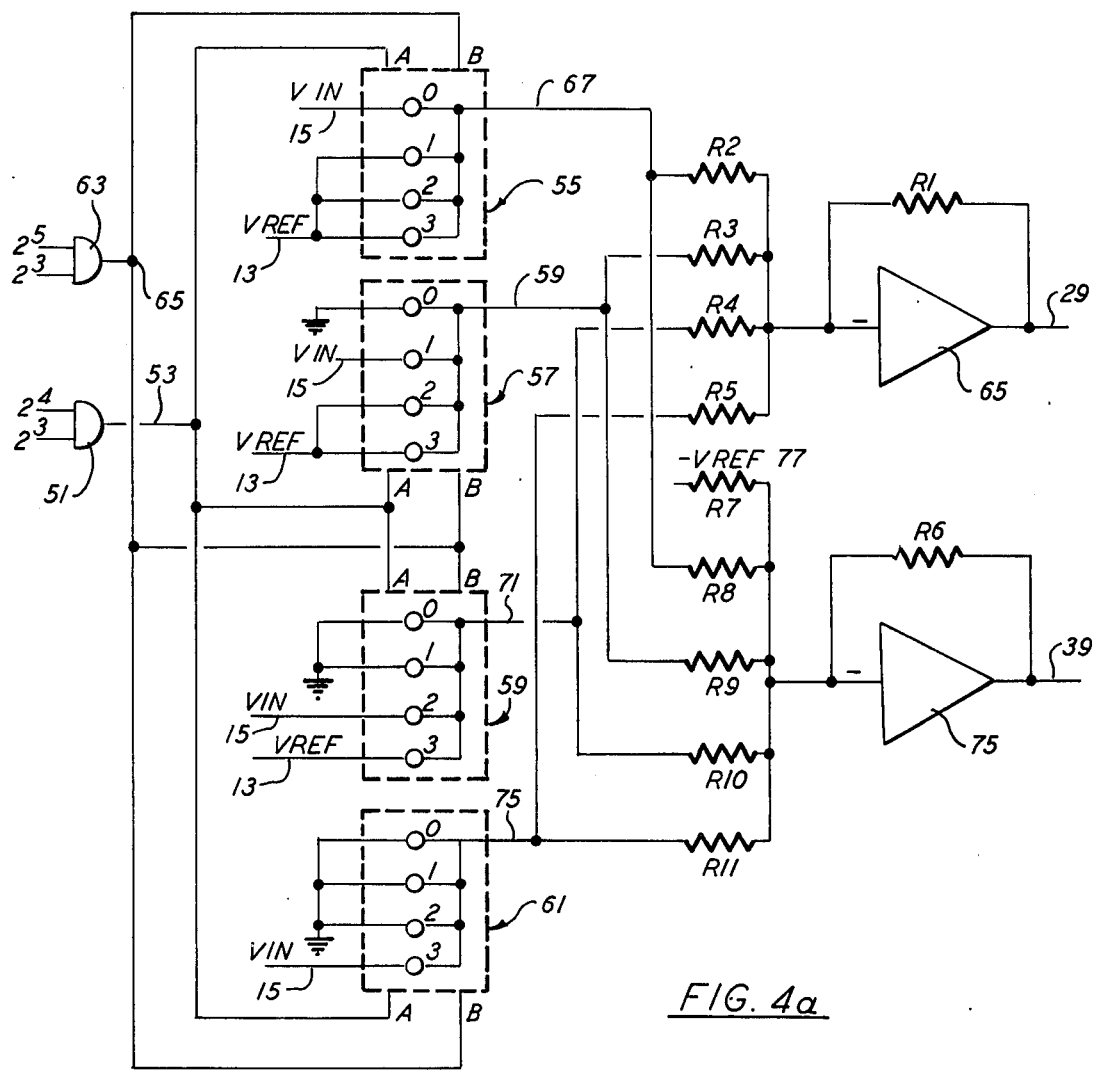
FIGS. 4a and 4b are a detailed diagram of the slope and intercept selection circuit and the sine and cosine computation circuits used in the embodiment of FIG. 3 and an input-output table for an analog switch.

FIG. 4(a) shows the design of the slope and intercept selection circuit 19. The values of the third and fourth bits of the digital input signal are fed into an Exclusive Or gate 51 which has an output on line 53 equal to "0" when the third and fourth bits of the digital input signal have identical values, and an output on line 53 to "1" otherwise. The output on line 53 of Exclusive Or gate 51 is coupled to the "A" inputs of analog switches 55, 57, 59 and 61. The third and fifth bits of the digital input signal are fed into Exclusive Or gate 63 which has an output on line 65 equal to "0" when the third and fifth bits of the digital input signal have identical values and an output on line 65 equal to "1" otherwise. The output on line 65 of Exclusive Or gate 63 is connected to the "B" inputs of analog switches 55, 57, 59 and 61. Each of analog switches 55, 57, 59 and 61 uses its "A" and "B" inputs to connect its "0", "1", "2" or "3" input to its output, as shown by the table in FIG. 4(b). The reference voltage VREF at terminal 13 is connected to the "1", "2" and "3" inputs of analog switch 55, the "2" and "3" inputs of analog switch 57, and the "3" input of analog switch 59. The "0" input of analog switch 57, the "0" and "1" input of analog switch 59, and the "0", "1" and "2" inputs of analog switch 61 are all grounded. The output on line 15 of the converter 11 is connected to input "0" of analog switch 55, input "1" of analog switch 57, input "2" of analog switch 59, and input "3" of analog switch 61.

The sine function generator consists of four precision resistors connected to the inverting input of amplifier 65. A feedback resistor R1 is connected between the inverting input and the output of amplifier 65. The ratio of resistance R1 to R2 equals the first sine slope value $m_{s1}$. The ratio of resistance R1 to R3 equals the second sine slope value $m_{s2}$. The ratio of resistance R1 to R4 equals the third sine slope value $m_{s3}$. The ratio of R1 to R5 equals the fourth sine slope value $m_{s4}$. Resistance R2 is connected to the output on line 67 of analog switch 55, resistance R3 is connected to the output on line 69 of analog switch 57, resistance R4 is connected to the output on line 71 of analog switch 59, and resistance R5 is connected to the output on line 73 of analog switch 61. The output on line 29 of amplifier 65 is the sine function output.

The cosine function generator consists of five precision resistors connected to the inverting input of an amplifier 75 with a feedback resistor R6 connecting the same input to the output of the amplifier. The ratio of resistance R6 to R7 equals 1, which is the negative of the value of the first cosine intercept $b_{c1}$. The ratio of resistance R6 to resistance R8 equals the first cosine slope value $m_{c1}$. The ratio of the resistance R6 to the resistance R9 requals the second cosine slope value $m_{c2}$. The ratio of the resistance R6 to the resistance R10 equals the third cosine slope value $m_{c3}$. The ratio of the resistance R6 to the resistance R11 equals the fourth cosine slope value $m_{c4}$. Resistance R7 is connected to the negative of the reference voltage − VREF at terminal 77. Resistance R8 is connected to the output on line 67 of analog switch 55, resistance R9 is connected to the output on line 69 of analog switch 57, resistance R10 is connected to output on line 71 of analog switch 59 and resistance R11 is connected to output on line 73 of analog switch 61. The output on line 39 of amplifier 75 is the cosine function output.

Figures 5, 6:
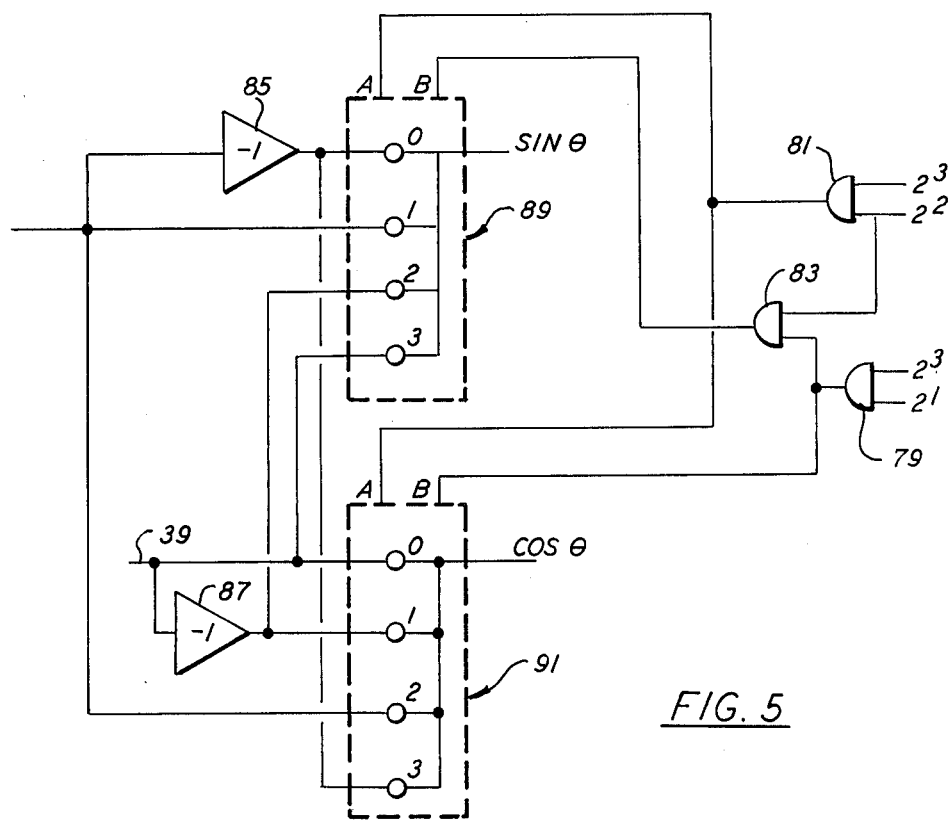
FIG. 5 is a detailed diagram of the octant and sign select cicuit used in the embodiment of FIG. 3.
FIG. 6 shows a sample digital input signal.

FIG. 5 shows the design of the octant and sign select circuit 41. The first and third bits of the digital input signal are fed into an Exclusive Or gate 79. The second and third bits of the digital input signal are fed into an Exclusive Or gate 81. The second bit of the digial input signal and the output of Exclusive Or gate 79 are fed into Exclusive Or gate 83. The sine function output on line 29 is fed into the inverting input of inverting amplifier 85. The cosine function output on line 39 is fed into the inverting input of inverting amplifier 87.

Analog switch 89 has an "A" input connected to the output of Exclusive Or gate 81, a "B" input connected to the output of Exclusive Or gate 83, a "0" input connected to the output of inverting amplifier 85, a "1" input connected to sine function output on line 29, a "2" input connected to the output of inverting amplifier 87 and a "3" input connected to the cosine function output on line 39. The output of analog switch 89 represents sine θ.

Analog switch 91 has an "A" input connected to the output of Exclusive Or gate 81, a "B" input connected to the output of Exclusive Or gate 79, a "0" input connected to the cosine function output on line 39, a "1" input connected to the output of inverting amplifier 87, a "2" input connected to the sine function input on line 29, and a "3" input connected to the output of inverting amplifier 85. The output of analog switch 91 represents cosine θ.

To illustrate the operation of the instant invention, assume the digital input shown in FIG. 6. This input represents 16.875°. The sixth through nth bits represents a value (B) equal to 5.625°. Since the input angle lies in an odd octant (I), the output on line 15 of the digital to analog converter 11 equals VREF × (B/11.25°) or VREF × ½. This output on line 15 goes into the slope and intercept selection circuit 19. Since the third and fourth bits of the digital input signal have a "0" value, the Exclusive Or gate 51 generates a "0" output which is the "A" input of analog switches 55, 57, 59 and 61. Since the third bit of the digital input signal has a "0"

value and the fifth bit of the digital input signal has a "1" value, Exclusive Or gate 63 generates a "1" output which is the "B" input of analog switches 55, 57, 59 and 61. The analog switches 55, 57, 59 and 61 "read" their respective "A" and "B" inputs as "01" and connect to their respective "1" inputs to outputs on lines 67, 69, 71 and 73. This means that the output on line 67 is connected to VREF at terminal 13, the output on line 59 is connected to the output on line 15 (which is VREF × ½), and the outputs on lines 71 and 75 are grounded. Thus R4 and R5 are grounded, R3 has a voltage of VREF × ½ applied to it, and R2 has a voltage of VREF applied to it. The voltage output on line 29 is: $-[(R1/R2) \times VREF + (R1/R3) \times \frac{1}{2} \times VREF + R1/R4 \times O + R1/R5 \times O] = -VREF (R1/R2 + R1/2R3) \approx$ sine 16.875°.

The inputs to resistors R10 and R11 are grounded, the input to resistor R9 is ½ × VREF, and the input to resistor R8 is VREF. The voltage on the output on line 39 of amplifier 75 is: $- [ -VREF (R6/R7) + VREF (R6/R8) + (\frac{1}{2} \times VREF) (R6/R9) + O (R6/R10) + O (R6/R11)] = VREF (R6/R7 - R6/R8 - R6/2R9) \approx$ cosine 16.875°.

The amplifier outputs on lines 29 and 39 are connected to the octant and sign select circuit 41. Since the second and third bits of the digital input signal have a "0" value, the Exclusive Or gate 81 gives the "A" inputs of analog switches 89 and 91 a "0" value. Since the first through third bits of the digital input signal have a "0" value, the "B" inputs of analog switches 89 and 91 have a "0" value. Analog switch 89 reads its "A" and "B" inputs as "00" and connects the "0" input to the sine θ output. The "0" input is the output of inverting amplifier 85. This is the negative of the output on line 29 of amplifier 65. The analog switch 91 reads its "A" and "B" inputs as "00" and connects its "0" input to the cosine θ output. This "0" input is the output on line 39 of amplifier 75.

Other embodiments of the basic invention are possible. By changing to more convenient chord lengths and appropriate scaling of resistor networks input in binary codes decimal and other codes may be converted to resolver functions. The intercepts and slopes of chords may be shared or duplicated when repeated to minimize the number of switching components. Chords may be used to approximate the trigonometric functions through a range of 90°, eliminating the need for complementing the analog angle output. The invention may be combined with storage registers or shift registers to accomodate serial digital data. The invention may be coupled with output power amplifiers to interface with higher power load demands.

The invention may be coupled with isolation transformers to generate isolated resolver analog outputs over a wide range of voltages. The invention may be combined with a Scott "T" transformer to generate isolated synchro analog outputs at a wide range of line to line voltages. The invention may include multiplexing circuiting, sample and hold amplifiers, and output stages in order to generate multiple resolver and/or synchro analog voltages corresponding to multiple input digital words. Finally, the invention is capable of interfacing directly with state of the art digital hardware, i.e., DTL, TTL, CMOS.

The complement of the digital input angle may be accomplished by digital means before input into the R-2R ladder or by analog means operating on the output of the digital to analog converter. The digital control logic of the solid state switches may be internal to the switches, decoded by discrete logic, or generated by solid state read-only-memories. The digital to analog resolver converter can be constructed on a large printed circuit or smaller interwired boards. The precision resistors can be discrete or thin film deposited. The integrated circuits can be in dual-in-line packages, flat packs, or TO-5 hermetically sealed packages. The input switches and R-2R ladder network can be combined in a hybrid or monolithic integrated circuit. These and other modifications may be made without departing from the spirit of the invention which is intended to be limited solely by the appended claims.

What is claimed is:

1. In a method utilizing electronic circuitry for converting an m bit digital voltage signal representing an angle over an octant which is a portion of an n bit digital voltage signal representing an angle from 0° to 360° into an analog voltage signal representing a continuous periodic function of the angle to be used as an output of a digital to analog resolver converter comprising:
   a. dividing the continuous periodic function of the angle into an even number p of equal angular segment each segment having a slope with the same sign over the full segment where $\log_2 p$ is a nonnegative integer;
   b. determining and storing average slope and intercept information of each slope segment in electronic circuitry;
   c. converting the r least significant bits of the digital signal into an analog value in a digital to analog converter where $r = m - \log_2 p$;
   d. selecting in said electronic circuitry slope and intercept values in accordance with the remaining $\log_2 p$ bits of the m bit digital voltage signal and the $(m-1)$ th bit; and
   e. carrying out multiplication of the converted analog value by a selected slope and addition of selected intercept values in electronic circuitry, the improvement comprising;
   f. determining and storing in said electronic circuitry, as a first intercept, the intercept of a line segment subtending one of said angular segments;
   g. determining and storing the slopes of line segments subtending each of said angular segments in said electronic circuitry;
   h. selecting one of the slopes as the slope multiplier in accordance with the remaining $\log_2 p$ bits in said electronic circuitry;
   i. determining a partial intercept value in said electronic circuitry; and
   j. multiplying the analog value by the selected slope multiplier and adding to the results the partial intercept value and the first intercept in said electronic circuitry.

2. The method of claim 1 wherein said angular segments are segments of 11.25° and said angle between said first and second limits is at least 45°.

3. The method of claim 2 for generating a sine signal and a cosine signal for all angles between 0° and 360° with an n bit digital signal representing the angle between 0° and 360°, where m bits represent an angle increment of 45° and n is equal to m plus three, the three additional bits being the most significant bits, which comprises:
   converting the sixth to nth bits of the digitsl input signal into an analog output signal;

determining the number Z of the angular segment in which the angle represented by the analog output signal lies;

complementing the analog output signal if the third bit is presented indicating that the angle is in an even-numbered octant;

multiplying the analog output signal by a reference voltage to yield a modified analog output signal;

storing as a first cosine intercept value the negative of the reference voltage;

storing as first, second, third and fourth sine slope values the respective slopes of the line segments subtending the first, second, third and fourth angular segments of the sine function in the first octant;

storing as first, second, third and fourth cosine slope values the respective slopes of the line segments subtending the first, second, third and fourth angular segments of the cosine function in the first octant;

selecting the Zth sine and cosine value as the sine and cosine slope multiplier, respectively;

summing all slope values up to the (Z−1)th sine and cosine slope values as the sine and cosine partial intercept values, respectivey, if the third and fourth bits have identical values, otherwise summing zero and all sine and cosine slope values up to the (5−Z)th slope value as the sine and cosine partial intercept values, respectively;

multiplying the modified analog output value by the selected sine slope multiplier and adding the partial sine intercept value to produce a sine function signal approximating the sine value corresponding to the modified analog output signal;

multiplying the modified analog output signal by the selected cosine slope multiplier and adding the sum of the first cosine intercept value and partial cosine intercept value to produce a cosine function signal approximating the cosine value corresponding to the modified analog output signal;

designating the cosine function signal as a cosine output signal and the sine function signal as a sine output signal if the second and third bits of the digital input signal have identical values, otherwise designating the cosine function signal as the sine output signal and the sine function signal as the cosine output signal;

assigning a negative sign to the sine signal if the first bit is not present indicating that the magnitude of the angle is less than 180°, otherwise, if the first bit is present assigning a positive sign to the sine signal;

assigning a positive sign to the cosine signal if the first and second bits have identical values, otherwise assigning a negative sign to the cosine signal.

4. In a device for converting an m bit digital signal representing an angle between first and second limits into an analog signal representing a continuous periodic function of the angle comprising:

a. means for storing the slopes of line segments subtendng a number $p$, where $\log_2 p$ is non-negative integer, an equal angular segments which divide the continuous periodic function between the first and second limits;

b. means for storing intercept information;

c. means for converting the least significant $r$ bits of the digital signal into an anlog signal where $r = m - \log_2 p$;

d. means for selecting slope and intercept information in accordance with the remaining $\log_2 p$ bits and e. means for multiplying the analog signal by the slope multiplier and adding intercept values thereto, the improvement comprising:

f. the means for storing intercept information storing the intercept of one of said line segments as a first intercept; and g. the means for selecting being means to select one slope as a slope multiplier and the value 0 or the sum of the other slopes as a partial intercept in accordance with the remaining $\log_2 p$ bits; and h. the means for multiplying and adding being means to multplying the analog signal by the slope multiplier and add to the signal the sum of the first intercept and partial intercept.

5. The device of claim 4 wherein said slope storage means comprises means for storing the slopes of four line segments subtending four equal angular segments representing the value of said continuous periodic function over a range of at least 45°.

6. In a digital to analog resolver converter for generating a sine and cosine signal for all angles between 0° and 360°, where n bits of a digital input signal represent an angle between 0° and 360°, comprising:

a. a digital to analog converter for converting the sixth to nth bits of the digital input signal into an equivalent analog output signal and multiplying the equivalent analog output signal by a reference voltage to produce an analog output signal;

b. complement command means for complementing the analog output signal if the third bit is present indicating that the angle is in an even numbered octant;

c. sine storage means for storing sine slope and intercept values;

d. cosine storage means for storing cosine slope and intercept values;

e. segment computation means for determining the angular segment Z in which the angle represented by the analog output signal lies;

f. slope and intercept selection means;

g. cosine computation means;

h. sine computation means;

i. octant and sign select means for
   i. coupling the cosine function output to the cosine output and sine function output to the sine output if the second and third bits of the digital input signal have identical values, otherwise coupling the sine function output to the cosine output and the cosine function output to the sine output;
   ii. inverting said sine output voltage if the first bit is present indicating the magnitude of the angle is greater than 180°; and
   iii. inverting said cosine output voltage if the first and second bits are identical, the improvement comprising:

j. said sine storage means comprising:
   i. a plurality of sine slope storage means each with an input and output for storing as first through fourth sine slope values the slope of line segments subtending four equal angular segments of the first octant of the sine function;

k. said cosine storage means comprising:
   i. a plurality of cosine slope storage means each with an input and output for storing as first through fourth cosine slope values the slopes of the line segments subtending four equal angular segments of the first octant of the cosine function; and ii. cosine intercept storage means with an input connected to the negative of the reference voltage and an output for storing as the first cosine intercept value the intercept of the line segment subtending the first angular segment of the first octant of the cosine function;

l. said slope and intercept selection means comprising means for:
  i. connecting the input of one cosine slope storage means to the analog output signal to establish a cosine slope voltage;
  ii. connecting the input of one sine slope storage means to the analog output signal to establish a sine slope voltage;
  iii. connecting the inputs of the remaining cosine slope storage means to one of ground and the reference voltage to establish a partial cosine intercept voltage; and
  iv. connecting the inputs of the remaining sine slope storage means to one of ground and the reference voltage to establish a sine intercept voltage;

m. said cosine computation means comprising means with inputs connected to the output of the cosine slope storage means and the output of the cosine intercept storage means for generating a cosine function output voltage equal to the sum of the cosine slope voltage, partial cosine intercept voltage and the voltage on the output of the cosine intercept storage means; and n. said sine computation means comprising means connected to the outputs of the sine slopes storage means for generating a sine function output equal to the sum of the sine slope voltage and the sine intercept voltage.

7. The digital to analog resolver converter of claim 6 wherein said sine computation means comprises a first summing amplifier with an output and an inverting input and said sine storage means comprises second, third, fourth and fifth resistances each with its output attached to the inverting input of said first summing amplifier and a first, feedback resistance connected to the inverting input and the output of said first summing amplifier and having a ratio of said second resistance equal to the first sine slope value, a ratio to the third resistance equal to the second sine slope value, a ratio to said fourth resistance equal to the third sine slope value and a ratio to the fifth resistance equal to the fourth sine slope value.

8. The digital to analog resolver converter of claim 7 wherein said cosine computation means comprises a second summing amplifier with an output and an inverting input and said cosine intercept storage means and cosine slope storage means comprise:
  a. a seventh resistance with its input connected to the negative of the reference voltage and an output connected to the inverting input of said second amplifier, eighth, ninth, tenth and eleventh resistances each having an output connected to the inverting input of said second amplifier, a sixth, feedback resistor connected to the inverting input and the output of said second amplifier, the ratio of said sixth resistance to said seventh resistance being equal to one and equalling the cosine intercept value, the ratio of said sixth resistance to said eighth resistance equalling the first cosine slope value, the ratio of said sixth resistance to said ninth resistance equalling the second cosine slope value, the ratio of said sixth resistance to said tenth resistance equalling the third cosine slope value and the ratio of said sixth resistance to said eleventh resistance equalling the fourth cosine slope value.

9. The digital to analog converter resolver of claim 5 wherein said segment computation means comprises a first Exclusive Or gate with the third and fourth bits of the digital input signal as inputs and a second Exclusive Or gate with the third and fifth bits of the digital input signal as inputs; and said multiplier and intercept selection means comprises:
  a first analog switch with an "A" input connected to the output of the first Exclusive Or gate, a "B" input connected to the output of the second Exclusive Or gate, a "0" input connected to the analog output signal, "1", "2" and "3" inputs connected to the positive of the reference voltage and an output connected to the inputs of the second and eighth resistances;
  a second analog switch with an "A" input connected to the output of the first Exclusive Or gate, a "B" input connected to the output of the second Exclusie Or gate, a "0" input connected to ground, a "1" input connected to the analog output signal, "2" and "3" inputs connected to the positive of the reference voltage, and an output connected to the inputs of the third and ninth resistances;
  a third analog switch with an "A" input connected to the output of the first Exclusive Or gate, a "B" input connected to the output of the second Exclusive Or gate, a "0" and "1" input connected to ground, a "2" input connected to the analog output signal, a "3" input connected to the positive of the reference voltage, and an output connected to the inputs of the fourth and tenth resistances; and
  a fourth analog switch with an "A" input connected to the first Exclusive Or gate, a "B" input connected to the second Exclusive Or gate, "0", "1", and "2" inputs connected to ground, a "3" input connected to the analog output signal, and an output connected to the fifth and eleventh resistances.

10. The digital to analog resolver converter of claim 9 where said octant and sign select means comprises:
  a third Exclusive Or gate with the first and third bits of the digital input signal as inputs:
  a fourth Exclusive Or gate with the second bit of the digital input signal and the output of the third Exclusive Or gate as inputs;
  a fifth Exclusive Or gate with the second and third bits of the digital input signal as inputs;
  a third inverting amplifier with the output of the first inverting amplifier as an input voltage and the negative of the input voltage as an output;
  a fourth inverting amplifier with the output of the second inverting amplifier as an input and the negative of the input voltage as an output;
  a fifth analog switch with an "A" input connected to the output of the fifth Exclusive Or gate, a "B" input connected to the output of the fourth Exclusive Or gate, a "0" input connected to the output of the third inverting amplifier, a "1" input connected to the output of the first inverting amplifier, a "2" input connected to the output of the fourth inverting amplifier, and a "3" input connected to the output of the second inverting amplifier; and
  a sixth analog switch with an "A" input connected to the output of the fifth Exclusive Or gate, a "B"

input connected to the output of the third Exclusive Or gate, a "0" input connected to the output of the second inverting amplifier, a "1" input connected to the output of the fourth inverting amplifier, a "2" input connected to the output of the first inverting amplifier, and a "3" input connected to the output of the third inverting amplifier.

* * * * *